(12) United States Patent
Tsujii et al.

(10) Patent No.: US 6,969,904 B2
(45) Date of Patent: Nov. 29, 2005

(54) TRIMMING PATTERN

(75) Inventors: Yasuharu Tsujii, Nara (JP); Haruaki Morimoto, Osaka (JP); Yutaka Okui, Osaka (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 101 days.

(21) Appl. No.: 10/401,693

(22) Filed: Mar. 31, 2003

(65) Prior Publication Data
US 2004/0042243 A1    Mar. 4, 2004

(30) Foreign Application Priority Data
Sep. 4, 2002    (JP) ............................. 2002-259187

(51) Int. Cl.⁷ ............................................. H01L 29/04
(52) U.S. Cl. ...................... 257/569; 257/530; 257/533; 257/529; 257/360; 257/568; 257/567; 257/570
(58) Field of Search ................................ 257/529, 530, 257/209, 226, 283, 569, 568, 567, 570, 533, 257/360; 408/132, 467, 281, 601

(56) References Cited

U.S. PATENT DOCUMENTS 6,674,316 B2 *    1/2004    Romas et al. ............... 327/308

FOREIGN PATENT DOCUMENTS

| JP | 05021604 | 1/1993 |
|----|----------|--------|
| JP | 2001230325 | 8/2001 |

* cited by examiner

Primary Examiner—Nathan J. Flynn
Assistant Examiner—Fazli Erdem
(74) Attorney, Agent, or Firm—Rabin & Berdo, PC

(57) ABSTRACT

There is provided a trimming pattern enabling trimming to be implemented with ease and time required for trimming to be shortened without causing damage to internal elements. The invention provides the trimming pattern for use in trimming of a semiconductor integrated circuit, comprising two pads to which a voltage is applied, a thin line part interconnecting the two pads, and two connecting parts disposed away from each side of the thin line part, and connected to an adjustment circuit and the semiconductor integrated circuit, respectively. With the invention, trimming is executed by a method of turning the adjustment circuit connected to the connecting parts into the ON state by connecting fused metal of the thin line part to the connecting parts. In this case, since the fused metal can be caused to come into contact with the connecting parts nearby with greater ease than fusion cutting of the thin line part, trimming can be implemented with ease and in shorter time.

14 Claims, 2 Drawing Sheets

TRIMMING PATTERN

FIELD OF THE INVENTION

The present invention relates to a trimming pattern for use in making an adjustment to a semiconductor integrated circuit by selecting ON/OFF for connection with an adjustment circuit prepared in the semiconductor integrated circuit beforehand.

BACKGROUND OF THE INVENTION

Trimming is employed in the case of finely adjusting the characteristics of a semiconductor integrated circuit in whole, in particular, an analog circuit, by changing its resistance value, capacitance value, and inductance, aside from the inherent characteristics of a semiconductor device. Common methods of trimming include a laser trimming method, and a method of trimming by causing current to flow to pads connected to resistors and capacitors and by cutting wiring.

Herein, the laser trimming method is a method for executing trimming by directly burning off or cutting down resistance elements, and is capable of fine adjustment, but requires a dedicated apparatus using a laser. In contrast, the method of trimming by causing current to flow by use of the pads is a method for executing trimming by preparing beforehand a circuit wherein resistors and capacitors can be changed over, and by cutting wiring. This method is not capable of fine adjustment, but has an advantage of simplicity in that no dedicated apparatus is required.

More specifically, with the method of trimming by causing current to flow by use of the pads, a plurality of resistors, capacitors, and MOS gates, for use in adjustment, are connected to the pads of a trimming pattern, respectively, and when values of those elements need to be changed, an adjustment is made by causing current to flow between the pads, thereby cutting a thin line part interconnecting the pads.

A pattern shown in FIG. 1 is used as a layout pattern for conventional trimming. Pads A31, B32, connected to resistors and capacitors, respectively, and a thin line part 30 interconnecting the pads A31 and B32 are formed simultaneously with metallization during the step of forming multilayer wiring when manufacturing a semiconductor integrated circuit. The pads A31 and B32 are subsequently coated with an insulating film, but openings corresponding to the pads A31 and B32, respectively, are defined in the insulating film, thereby exposing the surface of metal. When a voltage is applied to the pads A31 and B32, current flows to the thin line part 30, whereupon the metal of the thin line part 30 undergoes fusion, and is cut upon completion of the fusion.

The mechanism of fusion cutting of metal is based on a phenomenon called the electromigration (EM), which is a phenomenon wherein flow of current causes atoms to migrate from one spot to the other spot. In this case, when electrons flow to unique grain boundaries (crevice between respective metal grains) occurring to a metal layer formed on a semiconductor by means of vapor deposition, sputtering, and so forth, atoms making up the metal layer collide with the electrons, thereby squeezing out metal. The phenomenon occurs due to the maximum current density of the metal layer such as metal patterns etc., and the smaller the cross-sectional area of the metal layer, orthogonal to the direction of current flow, becomes, the more prone to occurrence the phenomenon is.

A technical document relating the conventional technique described above is disclosed in JP, 2001-230325, A.

Incidentally, there has been continuing trends towards further miniaturization in the configuration of a semiconductor integrated circuit in recent years for higher performance of the semiconductor integrated circuit, and in addition, a level difference between the respective work surfaces of upper layers increases according as the upper layers become still higher due to further multilayer wiring. In the case of depositing metal over the level difference, the greater the level difference, the more insufficient coverage of the work surfaces with the metal becomes (the metal layers in stepped parts become thinner in thickness), so that the more miniaturized the metal pattern is, the higher there becomes the probability of a break occurring to the metal pattern, thus creating a cause for deterioration of reliability. Accordingly, a planarization process commonly called the CMP (Chemical Mechanical Polishing) process has since come to be used in order to improve the working accuracy of the metal pattern formed over the stepped parts. As a result of use of the CMP process, an interlayer insulating film formed underneath the metal layer is planarized, thereby improving the coverage with the metal.

Such planarization has become essential to the process of manufacturing a semiconductor integrated circuit, but has come to cause inconvenience to a pattern for trimming, formed on the interlayer insulating film.

With a conventional trimming pattern, thin line parts are formed on the stepped parts to facilitate cutting thereof, so that spots of the thin line parts, where a metal layer is thin in thickness, are cut off. However, as a result of improvement in the coverage with the metal, the metal in the thin line parts of the trimming pattern has come to be uniform in thickness, so that it has become difficult to easily cut the thin line parts by causing current to flow. Further, time required from the start of fusion of the metal until complete cutting has increased along with enhancement in tolerance, thereby lengthening work time required for trimming. Furthermore, there is no denying that continuous flow of high current between the pads of the trimming pattern will raise a possibility of an internal integrated circuit and internal elements as well being adversely affected.

SUMMARY OF THE INVENTION

It is therefore an object of the invention to provide a novel and improved trimming pattern enabling trimming to be implemented with ease and time required for trimming to be shortened without causing damage to internal elements. The invention provides the trimming pattern for use in trimming of a semiconductor integrated circuit, comprising two pads to which a voltage is applied, a thin line part interconnecting the two pads, and two connecting parts disposed away from each side of the thin line part, and connected to an adjustment circuit and the semiconductor integrated circuit, respectively.

With the invention, trimming is executed by a method of turning the adjustment circuit connected to the connecting parts into the ON state by connecting fused metal of the thin line part to the connecting parts. In this case, since the fused metal can be caused to come into contact with the connecting parts nearby with greater ease than fusion cutting of the thin line part, trimming can be implemented with ease and in shorter time.

BRIEF DESCRIPTION OF THE DRAWINGS

FIG. 3 shows schematic sectional views of the embodiment of the trimming pattern according to the invention, before and after fusion of metal, FIG. 3(A) being a sectional view thereof before the fusion of the metal while

DETAILED DESCRIPTION OF THE PREFERRED EMBODIMENTS

Figure 1:
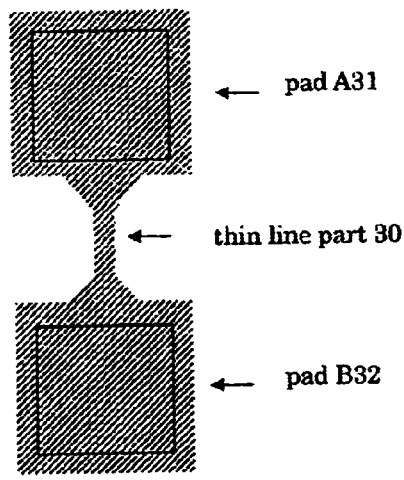
FIG. 1 is a schematic plan view of a conventional trimming pattern.

A preferred embodiment of a trimming pattern according to the invention is described in detail hereinafter with reference to the accompanying drawings. In the present specification and the accompanying drawings, constituent elements of the trimming pattern, having effectively identical functions, are denoted by the same reference numerals, thereby omitting duplicated description.

Figure 2:
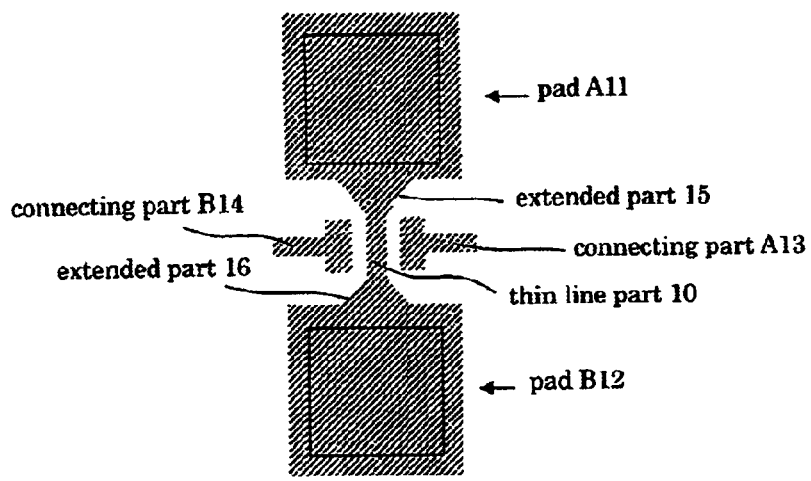
FIG. 2 is a schematic plan view showing an embodiment of a trimming pattern according to the invention.

FIG. 2 is a schematic plan view showing the embodiment of the trimming pattern according to the invention. As with the conventional trimming pattern, there are disposed pads, A11, B12, at respective ends of a thin line part 10 via extended parts, 15, 16, respectively. Connecting parts A13, B14 are formed on each side of the thin line part 10. One end of the connecting parts A13, B14, respectively, opposite from the other end thereof, facing the thin line part 10, is connected to an adjustment circuit, for example, resistors and capacitors, via wiring, and further to a semiconductor integrated circuit (not shown) that is a element proper.

The thin line part 10 is preferably as thin as possible so as to cause metal to undergo fusion without causing current to flow for many hours. However, if the thin line part 10 is rendered too thin, this will raise a possibility of occurrence of problems in that line fluctuation and working defects will result during the steps of performing photolithography and metal working, so that the thin line part 10 will be cut at the outset, time required for complete fusion of the metal will fluctuate by the pattern, and so forth. Accordingly, the thin line part 10 needs to have a width that is decided upon by taking into consideration such a possibility.

The respective ends of the thin line part 10 are linked with the pads, A11, B12, via the extended parts, 15, 16, respectively. When linking a thin line such as the thin line part 10 to a pattern of a large area such as the pads, there is generally the need for a linking pattern such as the extended parts, 15, 16, in order to prevent pattern peel-off from occurring during the steps of performing the photolithography and metal working.

The connecting parts A13, B14 are symmetrical in shape with respect to the thin line part 10, and preferably include a side thereof, parallel with the thin line part 10, and having a length substantially identical to the length of the thin line part 10, so that the connecting parts can be connected with each other upon the fusion of the thin line part 10 regardless of a spot where the fusion takes place. With the present embodiment, the connecting parts rectangular in shape are adopted as ones in shape that meets such requirements.

Further, a distance between the thin line part 10 and the connecting parts A13, B14, respectively, is preferably as narrow as possible so as to be able to implement connection between the connecting parts as soon as possible after the fusion of the thin line part 10. However, if the distance is rendered too narrow, this will cause problems in that line fluctuation and working defects will result during the steps of performing the photolithography and metal working, so that the thin line part 10 will be connected with the respective connecting parts, time required for the connection will fluctuate by the pattern, and so forth. Accordingly, the distance needs to be decided upon by taking into consideration such problems.

With a method of forming those patterns, metal is first deposited with the use of a sputtering system, vapor deposition system, etc., in the step of forming multilayer wiring for a semiconductor integrated circuit, and subsequently patterning is executed simultaneously with the step of performing the photolithography for metallization, followed by metal working, thereby forming the patterns. Since those patterns are not patterns for the element proper provided internally, but are patterns for use in adjustment, those patterns are preferably formed simultaneously with the steps of forming the element proper. Subsequently, the entire surface of the patterns is coated with an insulating film, and openings corresponding to the pads A11, B12, respectively, are defined in the insulating film to expose the surface of metal to enable a voltage to be applied to the pads A11, B12.

Now, a method of actual trimming is described hereinafter. In case of the need for adjustment due to the results of the characteristics of the semiconductor integrated circuit, that is, the element proper, a voltage is applied to the pads A11, B12. Thus, by causing current to flow to the thin line part 10 linking the pad A11 with the pad B12, the metal of the thin line part 10 undergoes fusion. Fused metal spreads to the peripheral area thereof to be thereby connected to the connecting part A13 and the connecting part B14, disposed on each side of the thin line part 10.

Figure 3A:
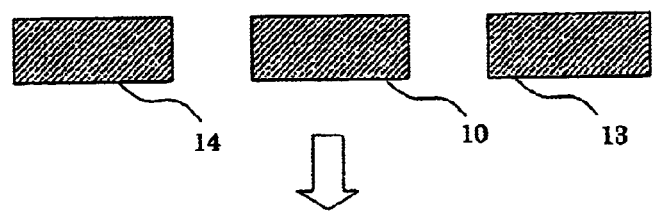
Figure 3B:
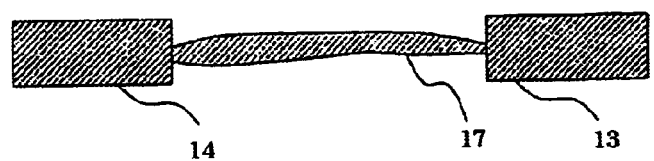
FIG. 3(B) is a sectional view thereof after the fusion of the metal.

FIG. 3 shows schematic sectional views of the trimming pattern before and after the fusion of the metal, and FIG. 3(A) is a sectional view before the fusion of the metal, FIG. 3(B) being a sectional view after the fusion of the metal. As a result of connection of the connecting part A13 with the connecting part B14 by the fused metal 17, the resistors and capacitors for adjustment, connected to the connecting part A13, and the connecting part B14, respectively, are connected with each other in circuital terms, thereby implementing adjustment. Even if the thin line part 10 is not cut at this point in time, this does not matter provided that the connecting part A13 is connected with the connecting part B14.

With the conventional method of trimming, the pads are directly connected to the resistors and capacitors for adjustment, and the adjustment circuit is turned OFF by cutting the thin line part. With the present embodiment, however, the adjustment circuit in the OFF state where the adjustment circuit is not connected with the connecting parts is turned into the ON state by connecting between the connecting parts, thereby executing trimming.

Thus, with the conventional method of trimming, time is required from the fusion of the metal of the thin line part until cutting of the metal, however, with the present embodiment, there is no need for causing the metal of the thin line part to be cut, and the fused metal is required simply to spread so as to be connected with the connecting part A13 and the connecting part B14, respectively, so that trimming can be implemented with ease and in shorter time than for the case of cutting the thin line part.

In addition, in the case of the conventional pattern, since elements for adjustment and further, the element proper internally provided are connected to the pads to which current is caused to flow, there is a possibility of current flowing for many hours causing damage to the element proper. With the present embodiment, however, since the element proper is not connected to the pads to which current is caused to flow, there is no risk of the element proper being damaged.

Having described the preferred embodiment of the trimming patter according to the invention with reference to the accompanying drawings, it is intended that the invention be not limited thereto. It will be obvious to those skilled in the art that various changes and modifications thereto may be made within the spirit and the scope of the invention as set out in the accompanying claims, and it is therefore to be understood that all such changes and modifications naturally fall within meets and bounds of the claims, or equivalence of such meets and bounds.

As described in the foregoing, with the invention, since trimming is executed with the use of the trimming pattern described above, trimming can be implemented such that the fused metal of the thin line part is caused to be connected to the connecting parts, disposed on each side of the thin line part, instead of causing the thin line part to be fused so as to be cut, thereby enabling the adjustment circuit to function. Hence, trimming can be implemented with ease and time required for trimming can be shortened. Furthermore, since there is no need to cause current to flow continuously to the pads for many hours until the thin line part is cut, trimming can be executed without worrying about damage done to the internal elements.

What is claimed is:

1. A trimming pattern of a semiconductor integrated circuit comprising:
    two pads to which a voltage is applied;
    a thin line part interconnecting the two pads; and
    two connecting parts disposed away from each side of the thin line part, and connected to an adjustment circuit and the semiconductor integrated circuit, respectively, wherein the two connecting parts are symmetrical in shape with respect to the thin line part, and include a side thereof, parallel with the thin line part, and having a length substantially identical to the length of the thin line part.

2. A trimming pattern according to claim 1, wherein the thin line part has the minimum width so as not to cause working defects.

3. A trimming pattern according to claim 1, wherein a distance between the thin line part and the two connecting parts, respectively, is the minimum distance so as not to cause working defects.

4. A trimming pattern according to claim 2, wherein a distance between the thin line part and the two connecting parts, respectively, is the minimum distance so as not to cause working defects.

5. A trimming pattern of a semiconductor integrated circuit, comprising:
    two pads to which a voltage is applied;
    a thin line part interconnecting the two pads; and
    two connecting parts disposed away from each side of the thin line part, and connected to an adjustment circuit and the semiconductor integrated circuit, respectively,
    wherein the thin line part, the two pads, and the two connecting parts are formed simultaneously with metallization at the uppermost layer at the time of forming multilayer wiring for the semiconductor integrated circuit; and
    wherein the thin line pattern and the two connecting parts are located sufficiently close to each other such that the two connecting parts are electrically connected by the thin line part when the voltage is applied to the two pads.

6. A trimming pattern according to claim 5, wherein the thin line part has the minimum width so as not to cause working defects.

7. A trimming pattern according to claim 5, wherein the two connecting parts are symmetrical in shape with respect to the thin line part, and include a side thereof, parallel with the thin line part, and having a length substantially identical to the length of the thin line part.

8. A trimming pattern according to claim 5, wherein a distance between the thin line part and the two connecting parts, respectively, is the minimum distance so as not to cause working defects.

9. A trimming pattern according to claim 6, wherein a distance between the thin line part and the two connecting parts, respectively, is the minimum distance so as not cause working defects.

10. A semiconductor integrated circuit having a trimming pattern, comprising:
    a pair of electrode pads to which an electric current is applied;
    a thin metal pattern connected between the two electrode pads;
    a first connecting part located at a first side of the thin metal pattern, the first connecting part being electrically connected to a first circuit; and
    a second connecting part located at a second side of the thin metal pattern, the second connecting part being electrically connected to a second circuit;
    wherein the thin metal pattern electrically connects the first and second connecting parts when the electric current is applied to the electrode pads.

11. A semiconductor integrated circuit according to claim 10, wherein the first circuit is an adjustment circuit.

12. A semiconductor integrated circuit according to claim 11, wherein the adjustment circuit includes a resistor.

13. A semiconductor integrated circuit according to claim 11, wherein the adjustment circuit includes a capacitor.

14. A semiconductor integrated circuit according to claim 10, wherein the electrode pads, the thin metal pattern, and the first and second connecting parts are formed simultaneously with an uppermost conductive layer of the semiconductor integrated circuit.

* * * * *